(12) United States Patent
Chen et al.

(10) Patent No.: US 8,028,965 B2
(45) Date of Patent: Oct. 4, 2011

(54) ADJUSTABLE BRACKET FOR A SLIDE ASSEMBLY

(75) Inventors: Ken Ching Chen, Kaohsiung Hsien (TW); Chun Chiang Wang, Kaohsiung Hsien (TW)

(73) Assignee: King Slide Works Co., Ltd., Kaohsiung Hsien (TW)

( * ) Notice: Subject to any disclaimer, the term of this patent is extended or adjusted under 35 U.S.C. 154(b) by 335 days.

(21) Appl. No.: 12/465,129

(22) Filed: May 13, 2009

(65) Prior Publication Data

US 2009/0283652 A1  Nov. 19, 2009

(30) Foreign Application Priority Data

May 16, 2008  (TW) ................................. 97118308 A

(51) Int. Cl.
*A47B 63/00*  (2006.01)
*A47F 5/00*  (2006.01)

(52) U.S. Cl. ............. 248/298.1; 312/330.1; 312/334.44; 312/333

(58) Field of Classification Search ............... 248/298.1, 248/257, 265; 312/334.46, 334.44, 333, 312/330.1, 294
See application file for complete search history.

(56) References Cited

U.S. PATENT DOCUMENTS

| | | | |
|---|---|---|---|
| 5,571,256 A * | 11/1996 | Good et al. | 211/26 |
| 5,833,337 A * | 11/1998 | Kofstad | 312/334.5 |
| 5,941,621 A | 8/1999 | Boulay et al. | |
| 6,230,903 B1 | 5/2001 | Abbott | |
| 6,375,290 B1 * | 4/2002 | Lin et al. | 312/334.46 |
| 6,557,960 B2 | 5/2003 | Shih | |
| 6,601,713 B2 * | 8/2003 | Kaminski | 211/26 |
| 6,739,682 B2 | 5/2004 | Shih | |
| 6,773,080 B2 * | 8/2004 | Chen et al. | 312/265.1 |
| 6,979,067 B2 * | 12/2005 | Yang | 312/334.46 |
| 6,984,008 B2 * | 1/2006 | Milligan | 312/333 |
| 7,178,888 B2 * | 2/2007 | Judge et al. | 312/334.46 |
| 7,188,916 B2 | 3/2007 | Silvestro et al. | |
| 7,552,899 B2 * | 6/2009 | Chen et al. | 248/224.8 |
| 7,654,624 B2 * | 2/2010 | Huang et al. | 312/333 |
| 7,677,679 B2 * | 3/2010 | Hsiung et al. | 312/333 |
| 2002/0093795 A1 | 7/2002 | Gough et al. | |
| 2006/0152115 A1 | 7/2006 | Dubon et al. | |
| 2008/0036347 A1 | 2/2008 | Liang | |

* cited by examiner

*Primary Examiner* — Anita M King
(74) *Attorney, Agent, or Firm* — Rosenberg, Klein & Lee

(57) ABSTRACT

A bracket for a slide assembly includes a fixing base which is disposed on a slide assembly and includes a first wall, a second wall, a first side wall, and a channel. The first wall has a first bend portion perpendicular to the second wall. The second wall has a second bend portion corresponding to the first wall. A sliding member is slidably connected to the channel of the fixing base and includes a third wall, a fourth wall, and a second side wall. The third wall has a third bend portion perpendicular to the fourth wall. The fourth wall has a fourth bend portion corresponding to the third bend portion. A fixing member is connected to the sliding member and includes a fixing portion. The length of the sliding member is adjustable with respect to the fixing base to fit the longitudinal depth of a rack for mounting purpose.

12 Claims, 6 Drawing Sheets

US 8,028,965 B2

ADJUSTABLE BRACKET FOR A SLIDE ASSEMBLY

BACKGROUND OF THE INVENTION

1. Field of the Invention

The present invention relates to an adjustable bracket for a slide assembly, and more particularly to a bracket for a slide assembly applied to a rack.

2. Description of the Prior Art

There are several patents related to a bracket for a slide assembly, such as U.S. Pat. No. 7,188,916 to Silvestro et al, titled "Adjustable side rails and method of attaching same to mounting rails of cabinet racks"; U.S. Publication No. 2006/0152115 to Dubon et al, titled "Adjustable reinforcing bracket for telescoping slide rail assembly"; U.S. Publication No. 2008/0036347 to Liang, titled "Rail device for extracting computer equipment". The aforesaid references are incorporated herein by reference.

All of the brackets mentioned above are used for a rack to mount thereon. However, in order to have a bracket for all types of racks, the bracket must be able to adjust its length, which is the concept of this application, to have a one-for-all type bracket.

SUMMARY OF THE INVENTION

The present invention relates to an adjustable bracket for a slide assembly, which is applicable to all types of racks and provides better support strength.

According to a first aspect of the present invention, there is provided with an adjustable bracket for a slide assembly comprising:

a slide assembly comprising an outer rail;

a connecting member connected to the outer rail of the slide assembly, the connecting member having a connecting portion;

a fixing base secured to the slide assembly, the fixing base comprising a first wall, a second wall, a first side wall extending between the first wall and the second wall, and a channel defined among the first wall, the second wall and the first side wall, the first wall having a first bend portion perpendicular to the second wall, the second wall having a second bend portion corresponding to the first bend portion of the first wall;

a sliding member slidably connected to the channel of the fixing base, the sliding member comprising a third wall, a fourth wall, and a second side wall extending between the third wall and the fourth wall, the third wall having a third bend portion perpendicular to the fourth wall, the fourth wall having a fourth bend portion corresponding to the third bend portion of the third wall; and a fixing member securely connected to a first end of the sliding member, the fixing member comprising a third side wall and a fixing portion corresponding to the connecting portion of the connecting member.

According to a second aspect of the present invention, there is provided an adjustable bracket, comprising:

a fixing base comprising a first wall, a second wall, a first side wall extending between the first wall and the second wall, and a channel defined among the first wall, the second wall and the first side wall, the first wall having a first bend portion perpendicular to the second wall, the second wall having a second bend portion corresponding to the first bend portion of the first wall;

a sliding member slidably connected to the channel of the fixing base, the sliding member comprising a third wall, a fourth wall, and a second side wall extending between the third wall and the fourth wall, the third wall having a third bend portion perpendicular to the fourth wall, the fourth wall having a fourth bend portion corresponding to the third bend portion of the third wall; and a fixing member securely connected to a first end of the sliding member, the fixing member comprising a third side wall and a fixing portion extending and bending from one end of the third side wall.

According to a third aspect of the present invention, there is provided an adjustable bracket, comprising:

a fixing base comprising a first wall, a second wall, a first side wall extending between the first wall and the second wall, and a channel defined among the first wall, the second wall and the first side wall, the first wall having a first bend portion perpendicular to the second wall, the second wall having a second bend portion corresponding to the first bend portion of the first wall, the first side wall of the fixing base being provided with a first protuberance corresponding to the channel;

a sliding member slidably connected to the channel of the fixing base, the sliding member comprising a third wall, a fourth wall, and a second side wall extending between the third wall and the fourth wall, the third wall having a third bend portion perpendicular to the fourth wall, the fourth wall having a fourth bend portion corresponding to the third bend portion of the third wall, the second side wall of the sliding member being formed with a groove corresponding to the first protuberance of the fixing base, the groove of the second side wall of the sliding member being provided with a second protuberance, when the sliding member reaches a predetermined position with respect to the fixing base, the second protuberance of the sliding member engaging with the first protuberance of the fixing base to restrain the sliding member from any further movement with respect to the fixing base; and a fixing member securely connected to a first end of the sliding member, the fixing member comprising a third side wall and a fixing portion extending and bending from one end of the third side wall.

DETAILED DESCRIPTION OF THE PREFERRED EMBODIMENT

Figure 1:
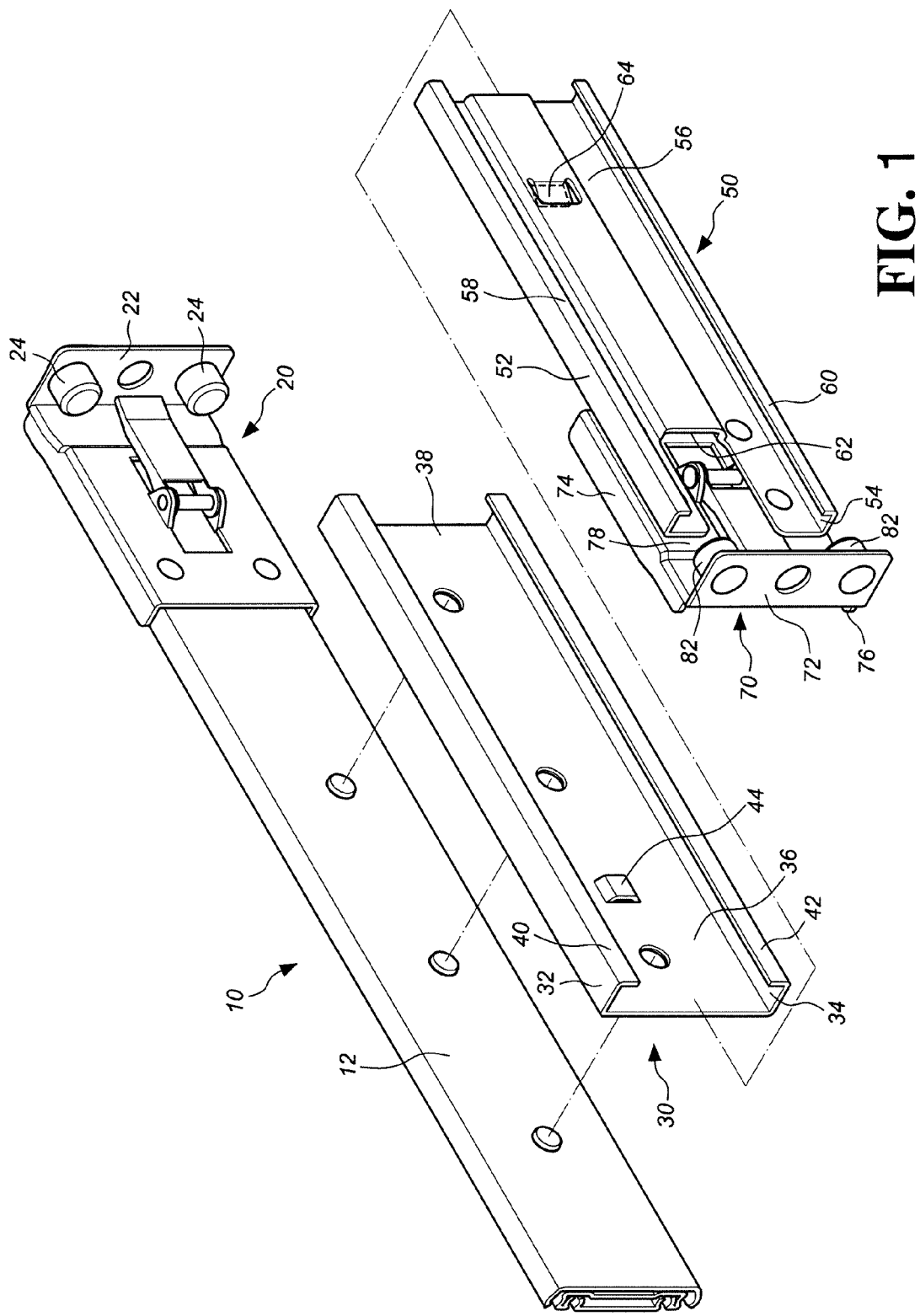
FIG. 1 is an exploded view of a preferred embodiment of the present invention.

As shown in FIG. 1, an adjustable bracket for a slide assembly according to a preferred embodiment of the present invention comprises a slide assembly 10, a connecting member 20, a fixing base 30, a sliding member 50, and a fixing member 70.

The slide assembly 10 comprises an outer rail 12.

The connecting member 20 is connected to one end of the outer rail 12 of the slide assembly 10. In this embodiment, the connecting member 20 comprises a connecting portion 22 and a pair of fixing pins 24 thereon.

Figure 2:
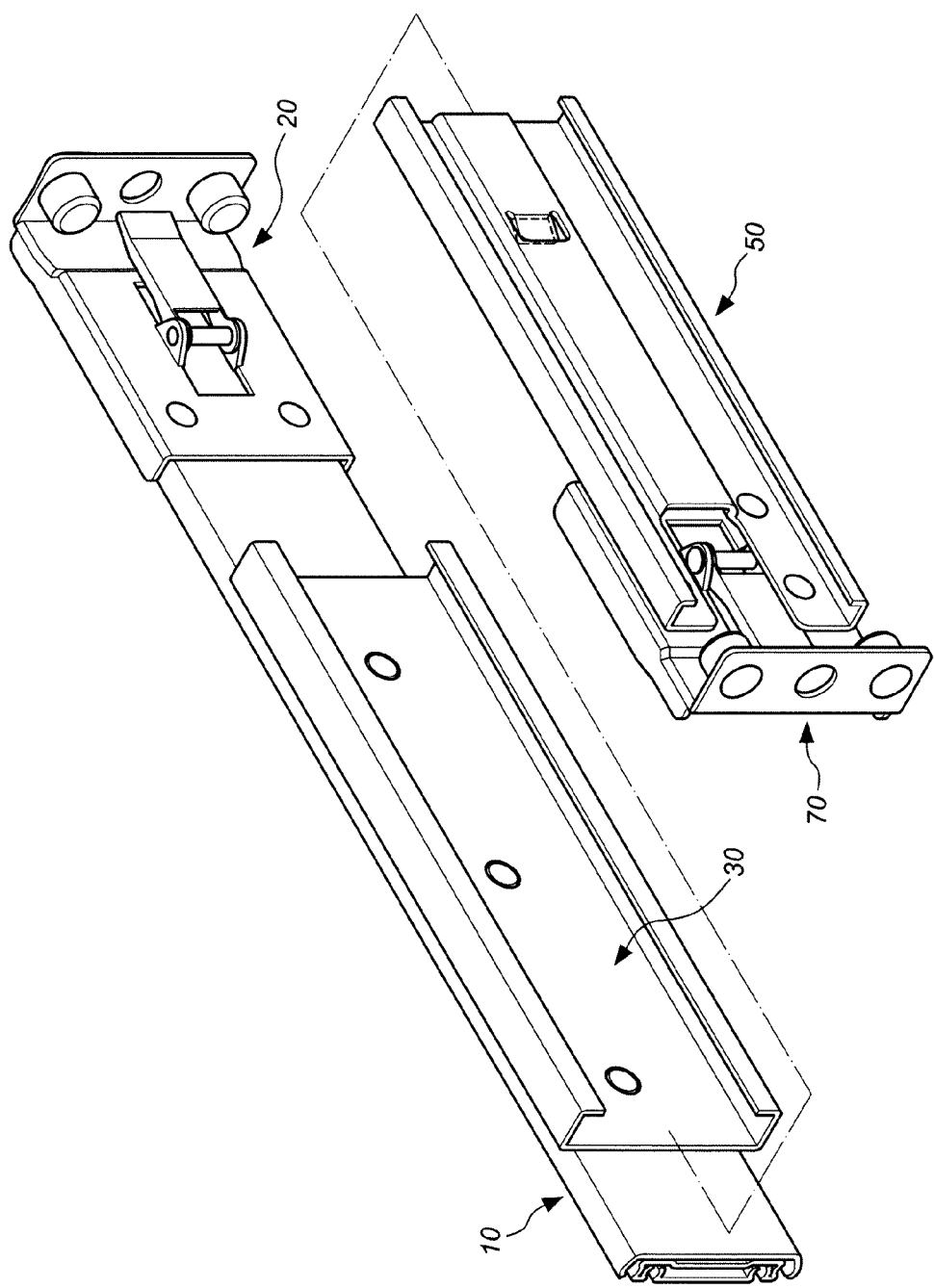
FIG. 2 is an exploded view showing a fixing base fixed to a slide assembly of the preferred embodiment of the present invention.

The fixing base 30 is secured to the slide assembly 10, as shown in FIG. 2. The fixing base 30 comprises a first wall 32, a second wall 34, a first side wall 36 extending between the first wall 32 and the second wall 34, and a channel 38 defined among the first wall 32, the second wall 34 and the first side wall 36. The first wall 32 of the fixing base 30 has a first bend portion 40 perpendicular to the second wall 34. The second wall 34 of the fixing base 30 has a second bend portion 42 corresponding to the first bend portion 40 of the first wall 32 of the fixing base 30. In this embodiment, the channel 38 of the fixing base 30 is provided with a first protuberance 44 therein.

The sliding member 50 is slidably connected to the channel 38 of the fixing base 30. The sliding member 50 comprises a third wall 52, a fourth wall 54 and a second side wall 56 extending between the third wall 52 and the fourth wall 54. The third wall 52 of the sliding member 50 has a third bend portion 58 perpendicular to the fourth wall 54. The fourth wall 54 has a fourth bend portion 60 corresponding to the third bend portion 58 of the third wall 52 of the sliding member 50. In this embodiment, the second side wall 56 of the sliding member 50 is formed with a groove 62 corresponding to the first protuberance 44 of the fixing base 30 to facilitate the sliding movement of the sliding member 50 in the channel 38 of the fixing base 30 smoothly. Further, the groove 62 of the sliding member 50 is provided with a second protuberance 64 therein. When the sliding member 50 reaches a predetermined position with respect to the fixing base 30, the second protuberance 64 of the sliding member 50 will engage with the first protuberance 44 of the fixing base 30 to restrain any movement of the sliding member 50 in the fixing base 30, referring to FIGS. 3 and 4.

Figure 5:
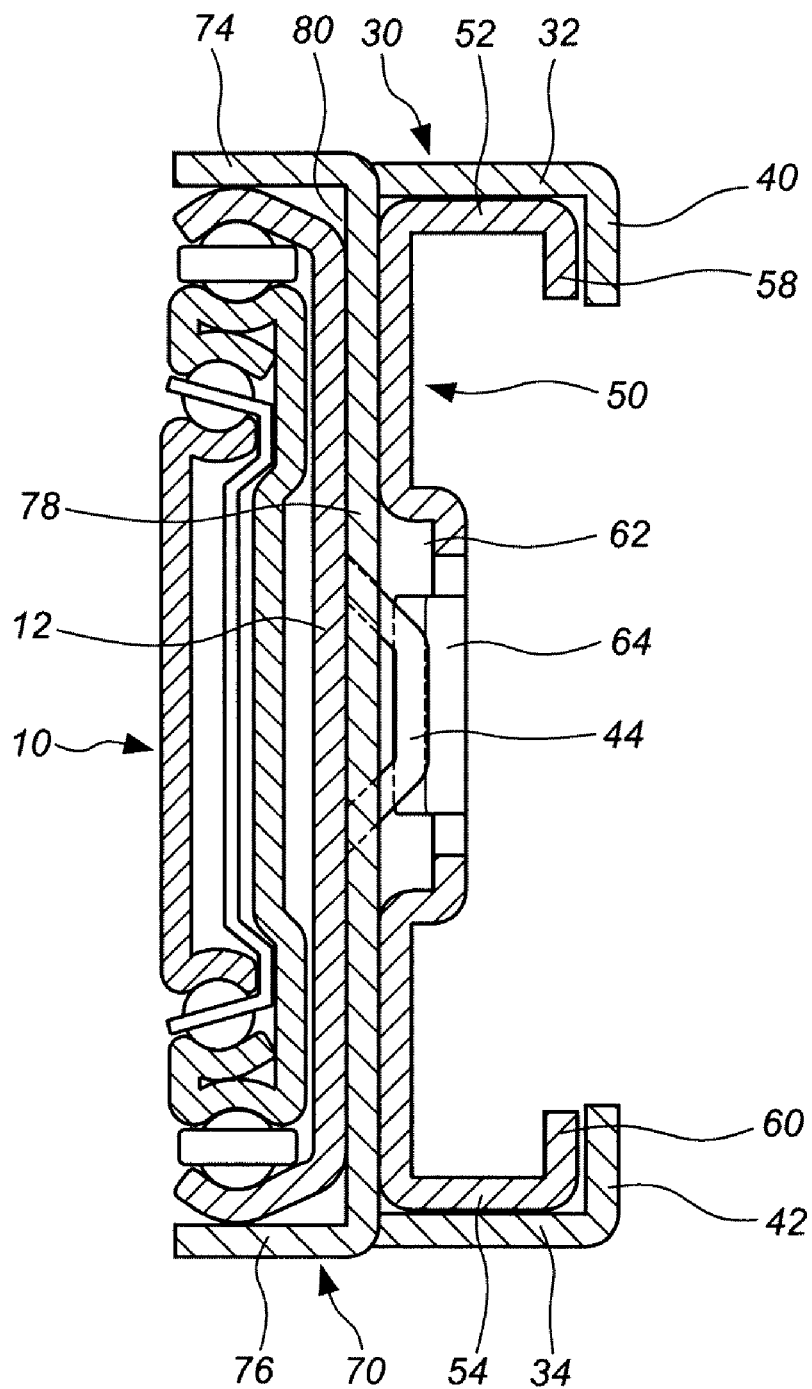
FIG. 5 is a cross-sectional view of the preferred embodiment of the present invention.

The fixing member 70 is secured to a first end of the sliding member 50. In this embodiment, the fixing member 70 comprises a fixing portion 72, an upper wall 74, a lower wall 76, a third side wall 78 extending between the upper wall 74 and the lower wall 76, and a holding surface 80 defined among the upper wall 74, the lower wall 76, and the third side wall 78, as shown in FIG. 5.

Figure 3:
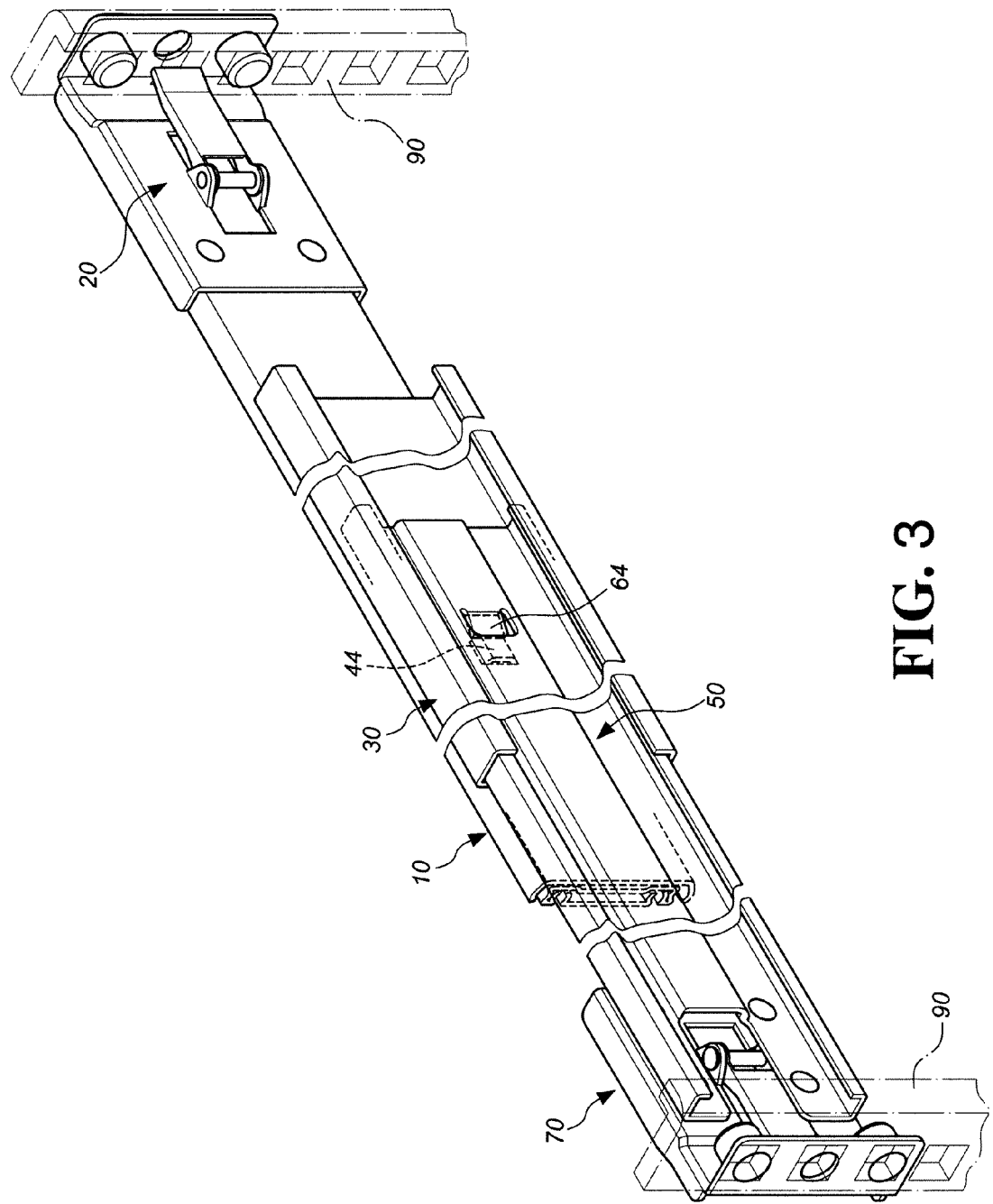
FIG. 3 is a perspective view of the preferred embodiment of the present invention in a first adjusted status.
Figure 4:
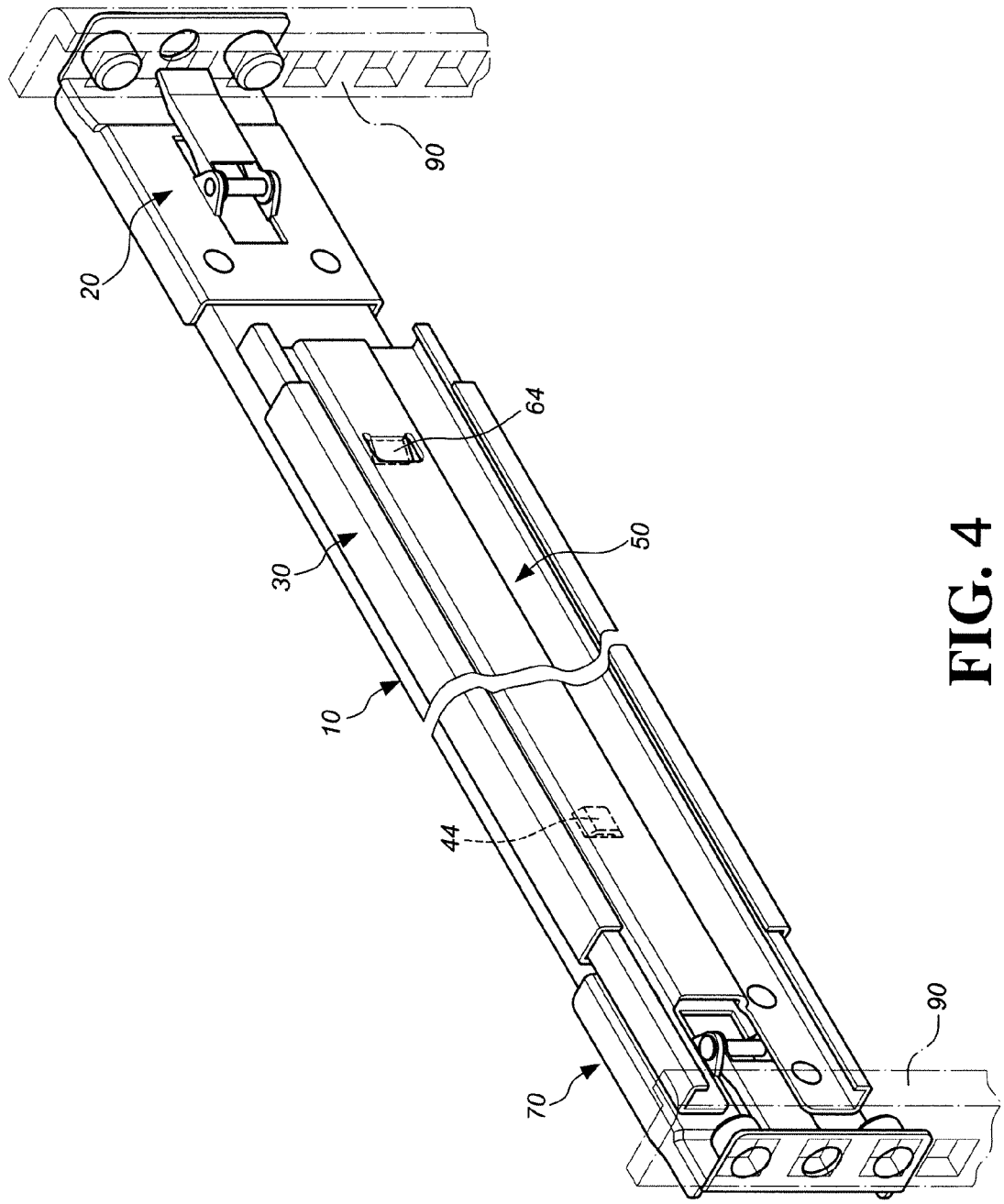
FIG. 4 is a perspective view of the preferred embodiment of the present invention in a second adjusted status.

FIGS. 3 and 4 are schematic views showing the preferred embodiment of the present invention in use. The length of the bracket of this embodiment is adjustable to fit a rack 90. The sliding member 50 is set to adjust its length according to the longitudinal depth of the rack 90 for securing the slide assembly 10 to the rack 90. In the event that the longitudinal depth of the rack 90 equals to the length of the slide assembly 50 including the bracket, as shown in FIGS. 4 and 5, the holding surface 80 is adapted to support the outer rail 12 of the slide assembly 10.

In this embodiment, the fixing portion 72 of the fixing member 70 is formed by bending a portion from one end of the third side wall 78, corresponding to the connecting portion 22 of the connecting member 20. The fixing portion 72 of the connecting member 70 comprises a pair of fixing pins 82 which corresponds to the fixing pins 24 of the connecting member 20.

Figure 6:
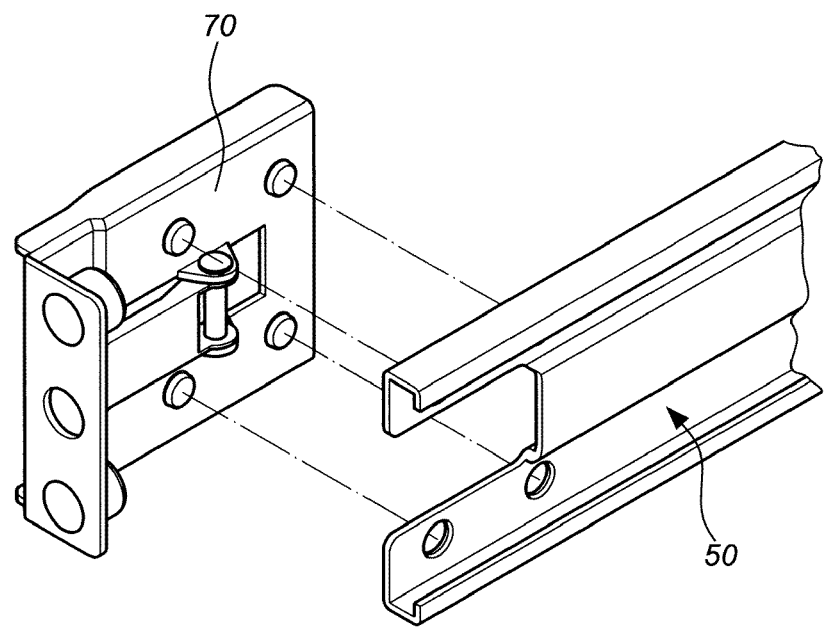
FIG. 6 is an exploded view of a fixing member and a sliding member of the preferred embodiment of the present invention.
Figure 7:
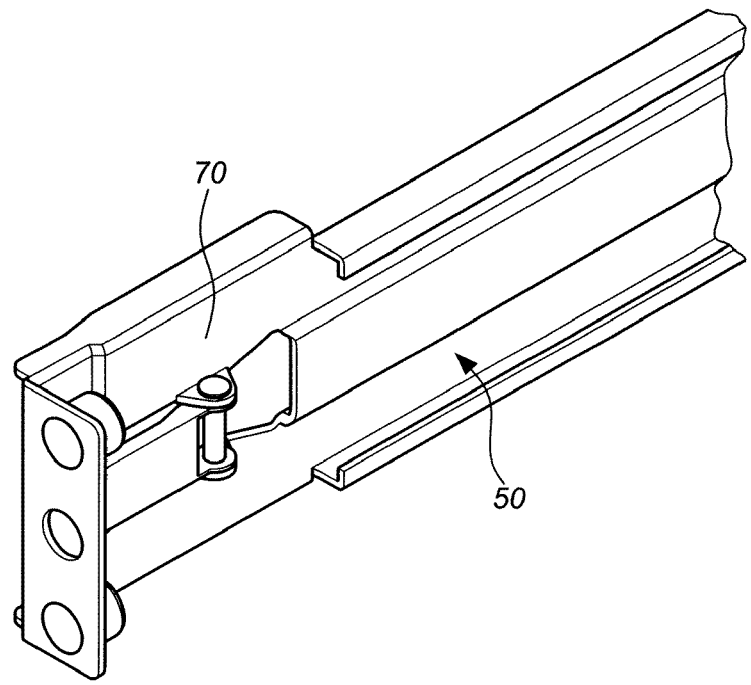
FIG. 7 is a perspective view of the fixing member extending from one end of the sliding member of the preferred embodiment of the present invention.

As to the technique of connecting the fixing member 70 to the first end of the sliding member 50, in this embodiment, the fixing member 70 and the sliding member 50 are two separate parts which are riveted together, as shown in FIG. 6. The fixing member 70 may be integrally formed with the first end of the sliding member 50, as shown in FIG. 7.

The present invention is applicable to racks in various sizes. The sliding design enhances the strength of support, and the fixing member used to support the slide assembly is another enhancement to the structure.

While there has been described and illustrated one specific embodiment of the invention, it will be cleared that variations in the details of the embodiment of the invention illustrated and described may be made without departing from the true spirit and scope of the invention as defined in the appended claims.

What is claimed is:

1. An adjustable bracket for a slide assembly comprising:
   a slide assembly comprising an outer rail;
   a connecting member connected to the outer rail of the slide assembly, the connecting member having a connecting portion;
   a fixing base secured to the slide assembly, the fixing base comprising a first wall, a second wall, a first side wall extending between the first wall and the second wall, and a channel defined among the first wall, the second wall and the first side wall, the first wall having a first bend portion perpendicular to the second wall, the second wall having a second bend portion corresponding to the first bend portion of the first wall;
   a sliding member slidably connected to the channel of the fixing base, the sliding member comprising a third wall, a fourth wall, and a second side wall extending between the third wall and the fourth wall, the third wall having a third bend portion perpendicular to the fourth wall, the fourth wall having a fourth bend portion corresponding to the third bend portion of the third wall; and
   a fixing member securely connected to a first end of the sliding member, the fixing member comprising a third side wall and a fixing portion corresponding to the connecting portion of the connecting member.

2. The adjustable bracket for a slide assembly, as claimed in claim 1, wherein the channel of the fixing base is provided with a first protuberance therein, the second side wall of the sliding member being formed with a groove corresponding to the first protuberance of the fixing base for facilitating the sliding member sliding in the channel of the fixing base smoothly.

3. The adjustable bracket for a slide assembly, as claimed in claim 2, wherein the groove of the sliding member is provided with a second protuberance, when the sliding member reaches a predetermined position with respect to the fixing base, the second protuberance of the sliding member engaging with the first protuberance of the fixing base to restrain the sliding member from any further movement with respect to the fixing base.

4. The adjustable bracket for a slide assembly, as claimed in claim 1, wherein an upper wall and a lower wall extend from the third side wall of the fixing member, respectively, and a holding surface is defined among the upper wall, the lower wall, and the third side wall for supporting the outer rail of the slide assembly.

5. The adjustable bracket for a slide assembly, as claimed in claim 1, wherein the fixing member is integrally formed with the first end of the sliding member.

6. An adjustable bracket, comprising:
   a fixing base comprising a first wall, a second wall, a first side wall extending between the first wall and the second wall, and a channel defined among the first wall, the second wall and the first side wall, the first wall having a first bend portion perpendicular to the second wall, the second wall having a second bend portion corresponding to the first bend portion of the first wall;

a sliding member slidably connected to the channel of the fixing base, the sliding member comprising a third wall, a fourth wall, and a second side wall extending between the third wall and the fourth wall, the third wall having a third bend portion perpendicular to the fourth wall, the fourth wall having a fourth bend portion corresponding to the third bend portion of the third wall; and a fixing member securely connected to a first end of the sliding member, the fixing member comprising a third side wall and a fixing portion extending and bending from one end of the third side wall.

7. The adjustable bracket as claimed in claim 6, wherein the channel of the fixing base is provided with a first protuberance therein and the second side wall of the sliding member is formed with a groove corresponding to the first protuberance of the fixing base for facilitating a smooth movement of the sliding member in the channel of the fixing base.

8. The adjustable bracket as claimed in claim 7, wherein the groove of the sliding member is provided with a second protuberance, when the sliding member reaches a predetermined position with respect to the fixing base, the second protuberance of the sliding member engaging with the first protuberance of the fixing base to restrain the sliding member from any further movement with respect to the fixing base.

9. The adjustable bracket as claimed in claim 6, wherein an upper wall and a lower wall extend from the third side wall of the fixing member, respectively, and a holding surface is defined among the upper wall, the lower wall, and the third side wall.

10. The adjustable bracket as claimed in claim 6, wherein the fixing member is integrally formed with the first end of the sliding member.

11. An adjustable bracket, comprising:

a fixing base comprising a first wall, a second wall, a first side wall extending between the first wall and the second wall, and a channel defined among the first wall, the second wall and the first side wall, the first wall having a first bend portion perpendicular to the second wall, the second wall having a second bend portion corresponding to the first bend portion of the first wall, the first side wall of the fixing base being provided with a first protuberance corresponding to the channel;

a sliding member slidably connected to the channel of the fixing base, the sliding member comprising a third wall, a fourth wall, and a second side wall extending between the third wall and the fourth wall, the third wall having a third bend portion perpendicular to the fourth wall, the fourth wall having a fourth bend portion corresponding to the third bend portion of the third wall, the second side wall of the sliding member being formed with a groove corresponding to the first protuberance of the fixing base, the groove of the second side wall of the sliding member being provided with a second protuberance, when the sliding member reaches a predetermined position with respect to the fixing base, the second protuberance of the sliding member engaging with the first protuberance of the fixing base to restrain the sliding member from any further movement with respect to the fixing base; and a fixing member securely connected to a first end of the sliding member, the fixing member comprising a third side wall and a fixing portion extending and bending from one end of the third side wall.

12. The adjustable bracket as claimed in claim 11, wherein the fixing member is integrally formed with the first end of the sliding member.

* * * * *